(12) United States Patent
Noguchi

(10) Patent No.: US 9,378,959 B2
(45) Date of Patent: Jun. 28, 2016

(54) METHOD OF MANUFACTURING INSULATED GATE TRANSISTOR SEMICONDUCTOR DEVICE

(71) Applicant: Fuji Electric Co., Ltd., Kanagawa (JP)

(72) Inventor: Seiji Noguchi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/844,919

(22) Filed: Sep. 3, 2015

(65) Prior Publication Data
US 2016/0086804 A1  Mar. 24, 2016

(30) Foreign Application Priority Data

Sep. 18, 2014 (JP) ................................. 2014-189991

(51) Int. Cl.
| | | |
|---|---|---|
| *H01L 29/732* | (2006.01) | |
| *H01L 21/266* | (2006.01) | |
| *H01L 29/423* | (2006.01) | |
| *H01L 21/265* | (2006.01) | |
| *H01L 21/324* | (2006.01) | |
| *H01L 29/66* | (2006.01) | |
| *H01L 29/739* | (2006.01) | |

(52) U.S. Cl.
CPC ........ *H01L 21/266* (2013.01); *H01L 21/26586* (2013.01); *H01L 21/324* (2013.01); *H01L 29/4236* (2013.01); *H01L 29/66348* (2013.01); *H01L 29/7397* (2013.01)

(58) Field of Classification Search
CPC .................................................. H01L 29/6634
See application file for complete search history.

(56) References Cited

U.S. PATENT DOCUMENTS

| | | | | |
|---|---|---|---|---|
| 6,489,204 B1* | 12/2002 | Tsui | ..................... | H01L 29/7813 257/302 |
| 2002/0160573 A1* | 10/2002 | Peake | ............... | H01L 29/66348 438/270 |
| 2004/0178457 A1* | 9/2004 | Francis | ............... | H01L 29/0839 257/397 |
| 2005/0179082 A1* | 8/2005 | Miyata | ................ | H01L 29/1095 257/330 |
| 2013/0082301 A1 | 4/2013 | Onozawa et al. | | |

FOREIGN PATENT DOCUMENTS

| | | |
|---|---|---|
| JP | 2006-120894 A | 5/2006 |
| JP | 2008-034615 A | 2/2008 |
| WO | 2012/124784 A1 | 9/2012 |

* cited by examiner

*Primary Examiner* — Zandra Smith
*Assistant Examiner* — Molly Reida
(74) *Attorney, Agent, or Firm* — Chen Yoshimura LLP

(57) ABSTRACT

First, a first resist mask for forming an $n^+$ emitter region is formed on the front surface of an $n^-$ semiconductor substrate. The first resist mask is left on the surface of the gate electrode. Next, a first ion implantation is performed with the first resist mask to form the $n^+$ emitter region. At this time, as the first ion implantation, both a perpendicular ion implantation is performed at an implantation angle that is perpendicular to the substrate front surface, and an oblique ion implantation at an implantation angle that is tilted relative to the direction perpendicular to the substrate front surface. The oblique ion implantation widens a width of the $n^+$ emitter region in the trench widthwise direction. Next, a second ion implantation is performed with a second resist mask to form a $p^+$ contact region. Thereafter, a heat treatment is used to diffuse and activate the $n^+$ emitter region and the $p^+$ contact region.

6 Claims, 14 Drawing Sheets

METHOD OF MANUFACTURING INSULATED GATE TRANSISTOR SEMICONDUCTOR DEVICE

BACKGROUND OF THE INVENTION

1. Technical Field

The present invention relates to a method of manufacturing a semiconductor device.

2. Background Art

IGBTs (insulated gate bipolar transistors) having trench gate structures are conventionally used as power devices for EVs (electric vehicles), EHVs (electric and hybrid vehicles), and the like, for example. The trench gate structure has a gate electrode embedded in a trench through an oxide film, and the trench is formed in the surface of the semiconductor substrate. The trench gate structure can be modified to have a finer cell structure than a coplanar gate structure having a gate electrode on the surface of the semiconductor substrate. A method of manufacturing a vertical IGBT having a trench gate structure will be explained below.

FIGS. 18 to 20 are cross-sectional views of a conventional semiconductor device during manufacturing. As shown in FIG. 18, a p-type base region 102 is first formed in the front surface layer of an $n^-$ semiconductor substrate (silicon (Si) substrate), which will serve as an $n^-$ drift layer 101. Next, a trench 103 that reaches from the substrate front surface to the n drift layer 101 by going through the p-type base region 102 is formed. Next, a thermal oxidation treatment and poly-Si doping are performed in the stated order, and etch-back is used to form a gate electrode 105 in the trench 103 through a gate insulating film (gate oxide film) 104. A thin oxide film (not shown), which will serve as a buffer layer for ion implantation, is then formed on the front surface of the $n^-$ semiconductor substrate. The ion implantation will be explained later.

Next, photolithography is performed to form a resist mask 111 on the front surface of the $n^-$ semiconductor substrate, and the open portions of this resist mask correspond to the area where a $p^+$ contact region 106 will be formed. Ion implantation 112 is then performed with this resist mask 111 to inject boron (B) at an implantation angle that is perpendicular to the front surface (primary surface) of the substrate. This selectively forms the $p^+$ contact region 106 in the surface layer of the p-type base region 102 near the center of an area (hereinafter, "mesa area") sandwiched by adjacent trenches 103. Next, the resist mask 111 is removed. As shown in FIG. 19, photolithography is then performed to form a resist mask 113 on the front surface of the $n^-$ semiconductor substrate, and the open portions of this resist mask correspond to the gate electrode 105 and the area where an $n^+$ emitter region 107 will be formed.

Next, ion implantation 114 is performed with this resist mask 113 and the gate electrode 105 as masks to inject arsenic (As) at an implantation angle that is perpendicular to the front surface of the substrate. This selectively forms the $n^+$ emitter region 107 on the front surface layer of a portion of the p-type base region 102 (mesa area) sandwiched by the trench 103 and the $p^+$ contact region 106. The $n^+$ emitter region 107 is formed to contact a portion of the gate insulating film 104 extending along the sidewall of the trench 103. The resist mask 113 is then removed. Next, as shown in FIG. 20, activation and thermal diffusion are performed by heat treatment, and the $p^+$ contact region 106 and $n^+$ emitter region 107 are set to respectively prescribed diffusion depths. The $n^+$ emitter region 107, in particular, is thermally diffused such that the top of the gate electrode 105 is positioned at a height inside the $n^+$ emitter region 107. Thereafter, conventional methods are used to form an interlayer insulating film, emitter electrode, $p^+$ collector layer, collector electrode (none shown in drawing), and the like, thereby completing the trench gate structure IGBT.

The following device has been proposed as a different trench gate structure MOS (metal-oxide film-semiconductor) semiconductor device. Among the first and second source regions and source contact regions, the first source region is closest to the gate electrode around the trench, and the second source region and source contact region are separated in this order from the gate electrode. The depth of the first source region is less than the depth of the second source region. The first source region is formed shallower by shortening the diffusion time, lowering the diffusion temperature, or adjusting the impurity implantation dosage (see Patent Document 1 below (paragraph [0018]), for example).

A different method of manufacturing the trench gate structure MOS (metal-oxide film-semiconductor) semiconductor device has been proposed as follows. Arsenic is selectively implanted in the p-type well region. During this time, arsenic is implanted perpendicular to the substrate surface from two directions: a slanted direction that tilts toward one lengthwise direction of the trenches, and a slanted direction that tilts towards the other direction. The implantation angle is 10 to 30 degrees perpendicular to the substrate surface. Next, heat treatment is performed to diffuse and activate the arsenic, thereby selectively forming an $n^+$ source region in the surface layer of the p-type well region. Thereafter, a $p^+$ well contact region is formed in the surface layer of an area of the p-type well region sandwiched by the $n^+$ source regions (see Patent Document 2 below (paragraphs [0030] to [0033], FIG. 6), for example).

Furthermore, a method has been proposed, as another method of manufacturing a trench gate structure MOS semiconductor device, whereby differing ion implantations are used to form a p-type contact region, n-type source region, and p-type counter region (p-type contact region) in the stated order. After this, these regions are collectively heat treated to diffuse and active the impurities (see Patent Document 3 below (paragraphs [0154] to [0155], FIG. 17, for example).

In Patent Document 3, ion implantation of arsenic is performed with the resist mask and the gate electrode in the trench as masks in order to form the n-type source region. Performing ion implantation in this manner to form the n-type source region on the surface of the gate electrode (trench top) without a resist mask prevents the n-type source region from being formed separate from the gate insulating film on the trench sidewall.

RELATED ART DOCUMENTS

Patent Documents

Patent Document 1: Japanese Patent Application Laid-Open Publication No. 2006-120894
Patent Document 2: Japanese Patent Application Laid-Open Publication No. 2008-034615
Patent Document 3: WO 2012/124784

SUMMARY OF THE INVENTION

In Patent Documents 1 to 3, however, the source region and the contact region are each formed by ion implantation; thus, there will be two rounds of photolithography in order to form the ion implantation mask. Furthermore, in Patent Document 1, differing ion implantation masks are created in order to form the first and second source regions. Therefore, if the patterning alignment of the ion implantation mask during photolithography deviates from a prescribed location based on the design parameters, the following problems may occur. In a trench gate structure IGBT, it is common to adjust the acceleration voltage and the like for ion implantation in order to make the depth of the p$^+$ contact region 106 greater than that of the n$^+$ emitter region 107, so as to prevent the occurrence of latchup, for example. Thus, if the patterning alignment of the resist mask 111 used for forming the p$^+$ contact region 106 deviates from the center of the mesa area towards the trench 103, then the lateral diffusion (orthogonal to the depth direction) of the p$^+$ contact region 106 during heat treatment thereafter will also deviate towards the trench 103. This lateral diffusion diffuses the p-type impurity (boron) of the p$^+$ contact region 106 to the portion below the n$^+$ emitter region 107 (collector side) where the channel (n-type inversion layer) is formed, or namely, to the portion of the p-type base region 102 sandwiched by the n$^+$ emitter region 107 and the n$^-$ drift layer 101. This increases the p-type impurity concentration of this portion. As a result, the threshold voltage Vth becomes higher than the prescribed value, and defects occur.

The following problems also occur in Patent Document 1. FIG. 17 is a cross-sectional view of a conventional semiconductor device during manufacturing. FIG. 17 shows a case in which ion implantation (hereinafter, "oblique ion implantation") 116 is performed from a slanted direction that is tilted, relative to the direction perpendicular to the substrate front surface, towards the direction in which the plurality of trenches 103 are arranged next to one another. This forms the n$^+$ emitter region 107. As shown in FIG. 17, the oblique ion implantation 116 for forming the n$^+$ emitter region 107 is performed without the resist mask 115 covering the top of the trenches 103 (the surface of the gate electrode 105 formed in the trenches 103). Therefore, there is a risk that the n-type impurity (arsenic) injected by the oblique ion implantation 116 will reach from the portion 118 of the gate insulating film 104 on the wall of the trench 103, which is exposed in the gap from the bottom of the resist mask 115 to the top of the gate electrode 105 formed by etch-back, to the mesa areas of the abutting single cells through the gate oxide film 104 (the portion shown by the dotted arrows), thereby forming an n$^+$ region 117 that does not mainly contribute in the surface layer of the mesa area of the abutting single cells. This may lower the breakdown voltage or destroy the device due to malfunctioning, the electric field concentrating at the n$^+$ region 117 when the device is OFF, and the like.

Accordingly, the present invention is directed to a scheme that substantially obviates one or more of the problems due to limitations and disadvantages of the related art. In order to solve the problems presented by the conventional technologies described above, at least one aspect of the present invention aims at providing a method of manufacturing a semiconductor device that can stably maintain prescribed electrical properties.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of manufacturing a semiconductor device, including: a first step of forming a first semiconductor region of a second conductivity type in a front surface of a semiconductor substrate of a first conductivity type; a second step of forming a plurality of trenches with prescribed gaps therebetween, the trenches penetrating the first semiconductor region in a depth direction; a third step of forming a gate electrode inside each of the trenches through a gate insulating film; a fourth step of forming, on the front surface of the semiconductor substrate, a first mask film that selectively exposes at least a portion of the first semiconductor region on a side of the trenches; a fifth step of forming a second semiconductor region of the first conductivity type through a first ion implantation of an impurity of the first conductivity type using the first mask film as a mask, the second semiconductor region being formed so as to contact a portion of the gate insulating film extending along a sidewall of the trenches; a sixth step of removing the first mask film; a seventh step of forming a second mask film on the front surface of the semiconductor substrate so as to selectively expose a portion of the first semiconductor region that is further away from the respective trenches than the second semiconductor region; an eighth step of forming, using the second mask film as a mask, a third semiconductor region of the second conductivity type through a second ion implantation of an impurity of the second conductivity type at an implantation angle that is perpendicular to the front surface of the semiconductor substrate, the third semiconductor region being formed such that an impurity concentration thereof is higher than the first semiconductor region and so as to contact the second semiconductor region; and a ninth step of removing the second mask film, wherein, in the fifth step, the first ion implantation includes an oblique ion implantation that implants the impurity of the first conductivity type at an implantation angle that is tilted towards a first direction relative to a direction perpendicular to the front surface of the semiconductor substrate, the first direction being a direction in which the plurality of trenches are arranged, and the oblique ion implantation being performed while a surface of the gate electrode is covered by the first mask film.

In another aspect, the present disclosure provides the abovementioned method of manufacturing the semiconductor device, wherein, in the fifth step, the first ion implantation further includes, in addition to the oblique ion implantation, an ion implantation that implants the impurity of the first conductivity type at an implantation angle that is perpendicular to the front surface of the semiconductor substrate.

In another aspect, the present disclosure provides the abovementioned method of manufacturing the semiconductor device, wherein, in the fifth step, the oblique ion implantation is performed at an implantation angle that is tilted 10 to 45 degrees towards the first direction relative to the direction perpendicular to the front surface of the semiconductor substrate.

In another aspect, the present disclosure provides the abovementioned method of manufacturing the semiconductor device, wherein, in the fifth step, the second semiconductor region is formed so as to have an H-like planar shape in which a width in a second direction orthogonal to the first direction is greater near the trench than away from the trench.

In another aspect, the present disclosure provides the abovementioned method of manufacturing the semiconductor device, further including, after the ninth step: a tenth step of performing a heat treatment to diffuse the second semiconductor region and the third semiconductor region to a prescribed depth.

In another aspect, the present disclosure provides the abovementioned method of manufacturing the semiconductor device, further including, after the tenth step: forming a first electrode that contacts the second semiconductor region and the third semiconductor region; forming a fourth semiconductor region of the second conductivity type in a front layer of a rear surface of the semiconductor substrate; and forming a second electrode that contacts the fourth semiconductor region.

According to the invention described above, the oblique ion implantation makes it possible to implant the n-type impurity from the portion of the first semiconductor region exposed by the first mask film to the portion below the first mask film; thus, it is possible to form the second semiconductor region so as to project into the area where the third semiconductor region will be formed. Furthermore, according to invention described above, the second ion implantation for forming the third semiconductor region is performed after the first ion implantation for forming the second semiconductor region; therefore, the second ion implantation can be performed in a state in which the portion of the area where the third semiconductor region will be formed on the trench side is amorphized. Accordingly, it is possible to suppress the p-type impurity concentration of the portion of the mesa area on the trench side from increasing, even if the patterning alignment of the second mask film used for forming the third semiconductor region deviates from the prescribed location. Due to this, the threshold voltage can be suppressed from rising above a prescribed value based on the design parameters.

Furthermore, according to the invention described above, the oblique ion implantation for forming the second semiconductor region is performed in a state in which the first mask film is covering the gate electrode surface (trench top); therefore, the n-type impurity from the oblique ion implantation will not be injected into the mesa areas of the abutting single cells. Accordingly, an $n^+$ region that does not contribute to primary operation will not be formed in the mesa areas of abutting single cells, and thus, it is possible to prevent a parasitic transistor from being formed. This enables the prevention of malfunctioning and destruction caused by the latchup of a parasitic transistor.

The method of manufacturing a semiconductor device according to at least one aspect of the present invention makes it possible to fabricate (manufacture) stably a semiconductor device having prescribed electrical properties that are based on the design parameters.

It is to be understood that both the foregoing general description and the following detailed description are exemplary and explanatory, and are intended to provide further explanation of the invention as claimed.

DETAILED DESCRIPTION OF EMBODIMENTS

Preferred embodiments of a method of manufacturing a semiconductor device according to the present invention will be described in detail below with reference to the attached drawings. In the present specification and attached drawings, electrons or holes in layers or areas marked with an "n" or "p" signify majority carriers. The "+" or "−" attached to the "n" or "p" respectively signify higher impurity concentrations and lower impurity concentrations than layers or areas without these marks. In the explanation of the embodiments below and the attached drawings, the same reference characteristics are attached to similar configurations and repetitive descriptions will be omitted.

Embodiment 1

Figure 2:
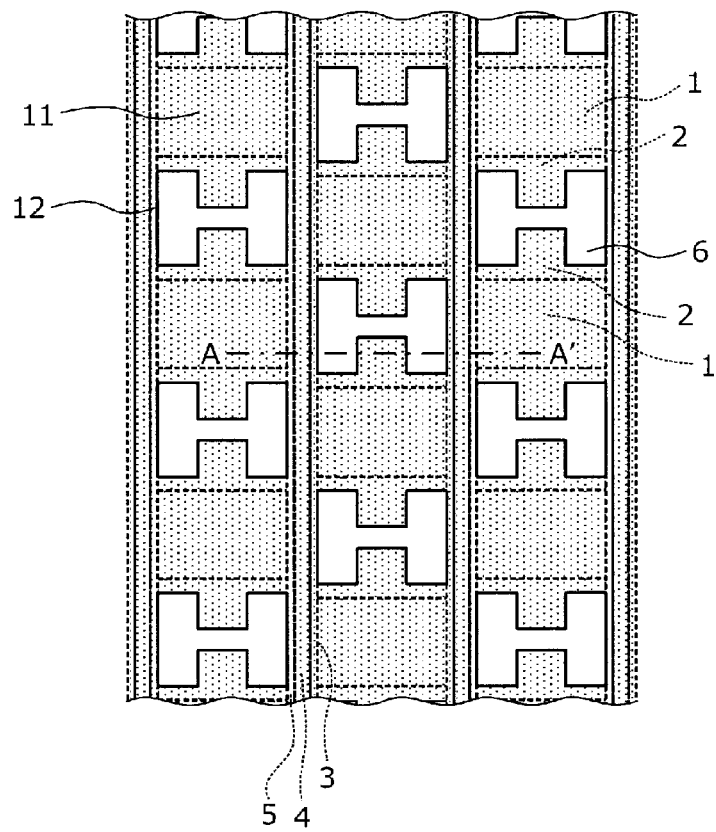
FIG. 2 is a plan view of the semiconductor device of Embodiment 1 during manufacturing.
Figure 3:
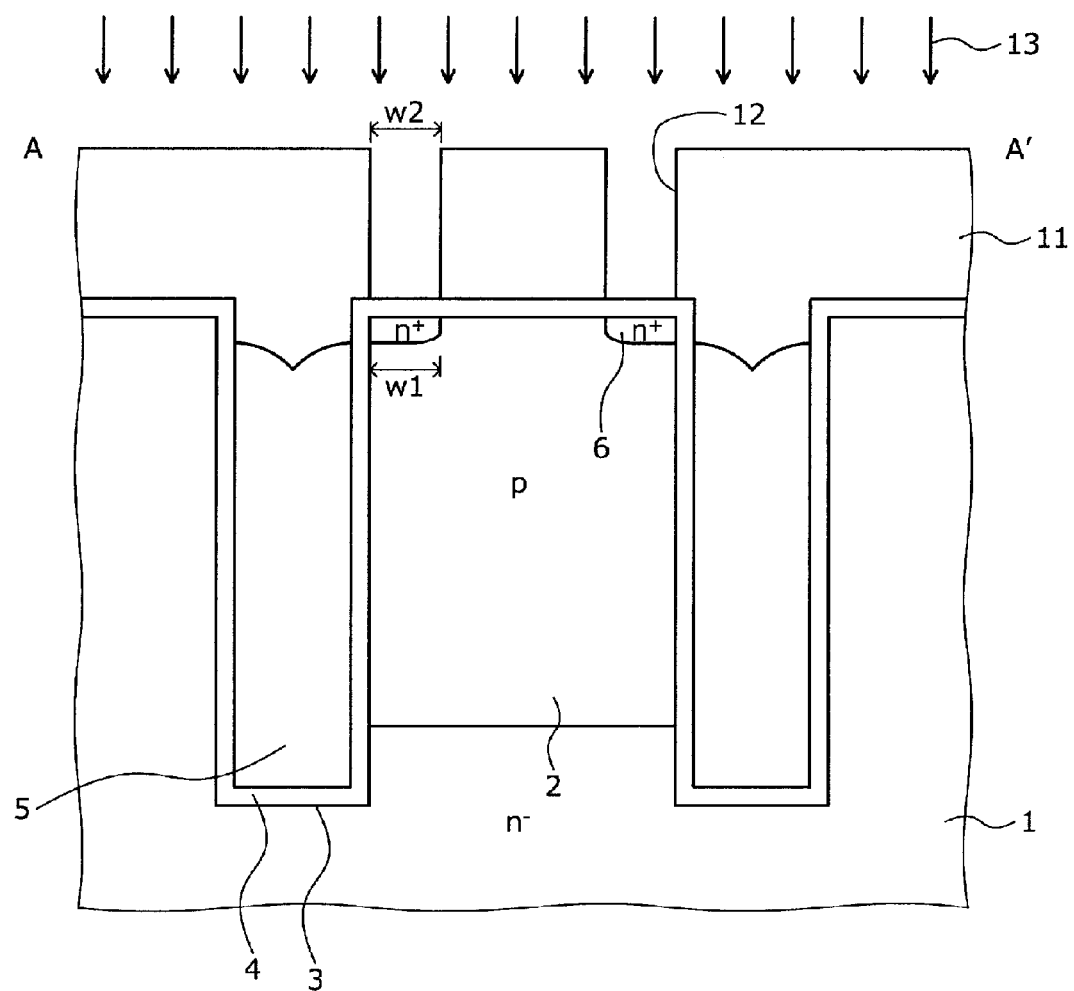
FIG. 3 is a cross-sectional view of the semiconductor device of Embodiment 1 during manufacturing.
Figure 4:
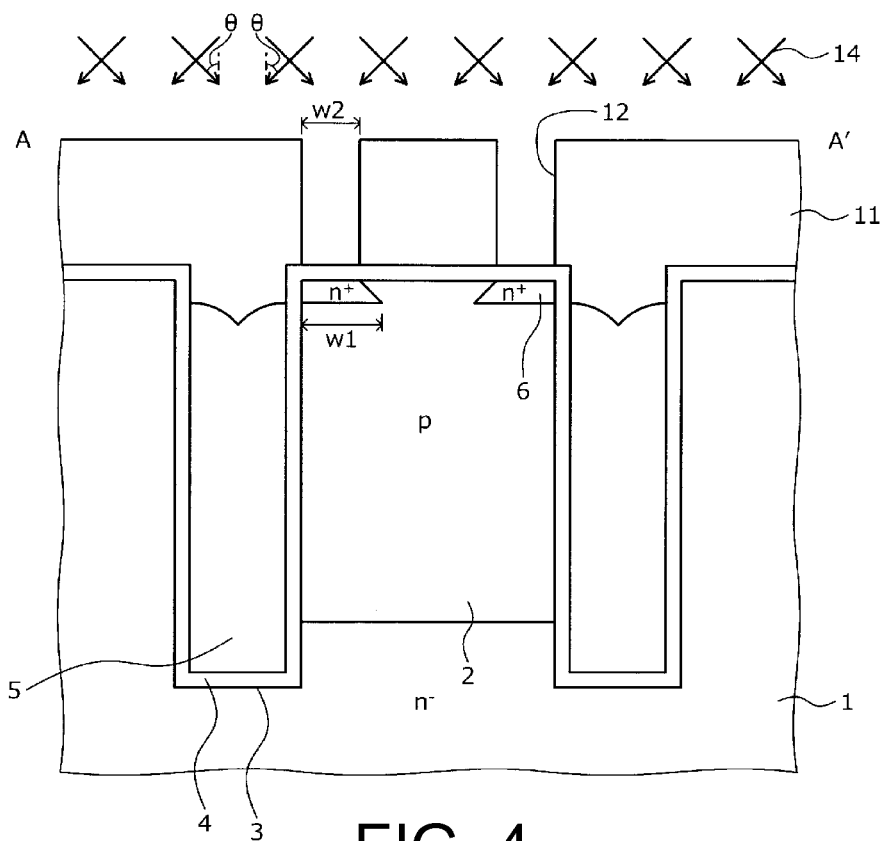
FIG. 4 is a cross-sectional view of the semiconductor device of Embodiment 1 during manufacturing.
Figure 5:
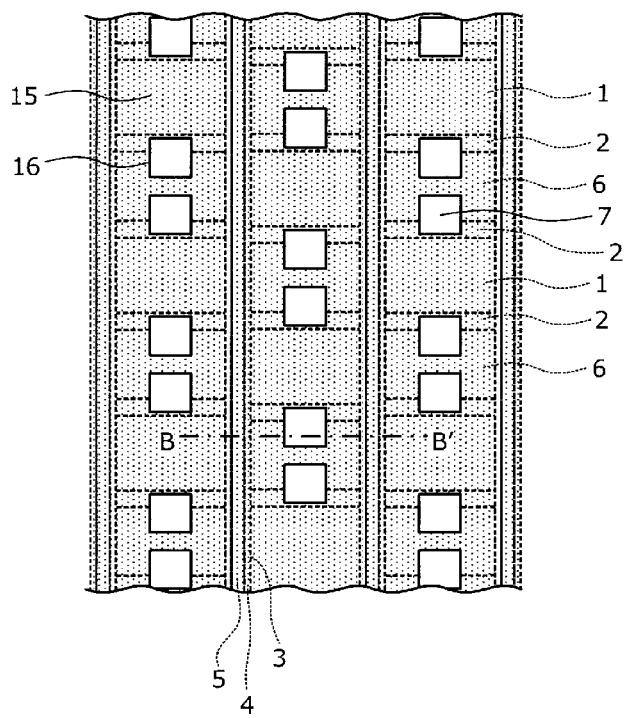
FIG. 5 is a plan view of the semiconductor device of Embodiment 1 during manufacturing.
Figure 6:
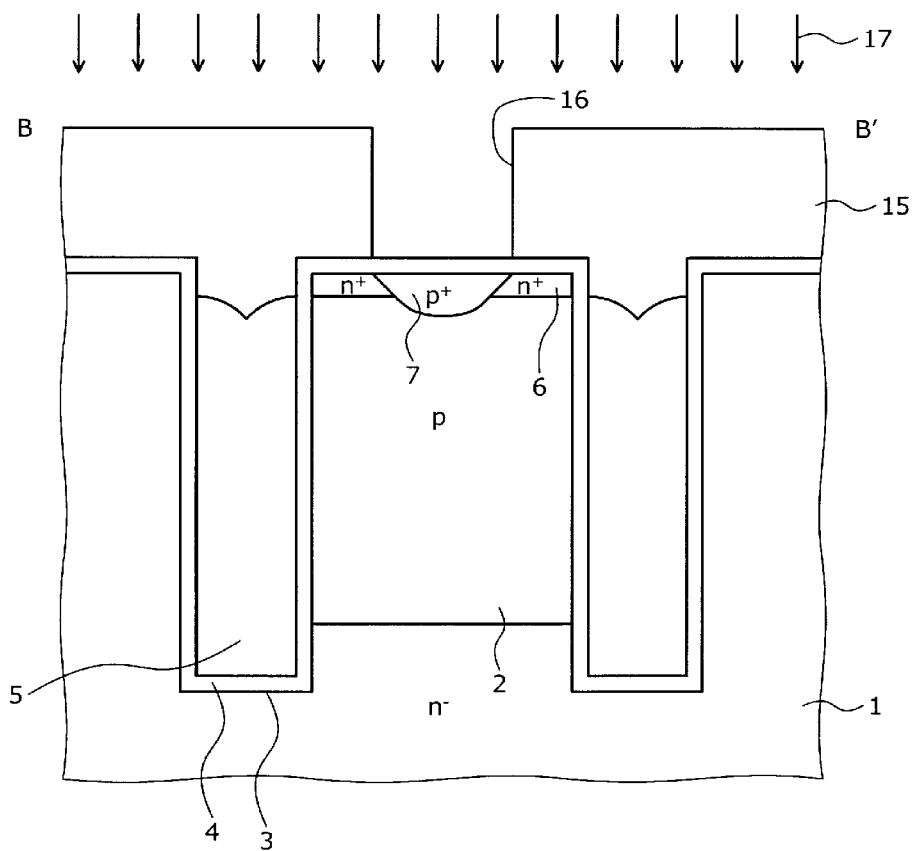
FIG. 6 is a cross-sectional view of the semiconductor device of Embodiment 1 during manufacturing.

A vertical IGBT having a trench gate structure with an ordinary MOS gate configuration (insulated gate formed by metal-oxide film-semiconductor) will be explained in an example of a method of manufacturing a semiconductor device according to Embodiment 1. FIGS. 1, 3, 4, and 6-8 are cross-sectional views of the semiconductor device of Embodiment 1 during the manufacturing thereof. FIGS. 2 and 5 are plan views of the semiconductor device of Embodiment 1 during the manufacturing thereof. FIGS. 2 and 5 respectively show planar patterns of first and second resist masks 11 and 15 for forming the corresponding $n^+$ emitter region (second semiconductor region) 6 and $p^+$ contact region (third semiconductor region) 7. FIGS. 3 and 4 show cross-sectional views of FIG. 2 along the line A-A'. FIG. 6 shows a cross-sectional structure of FIG. 5 along the line B-B'.

Figure 1:
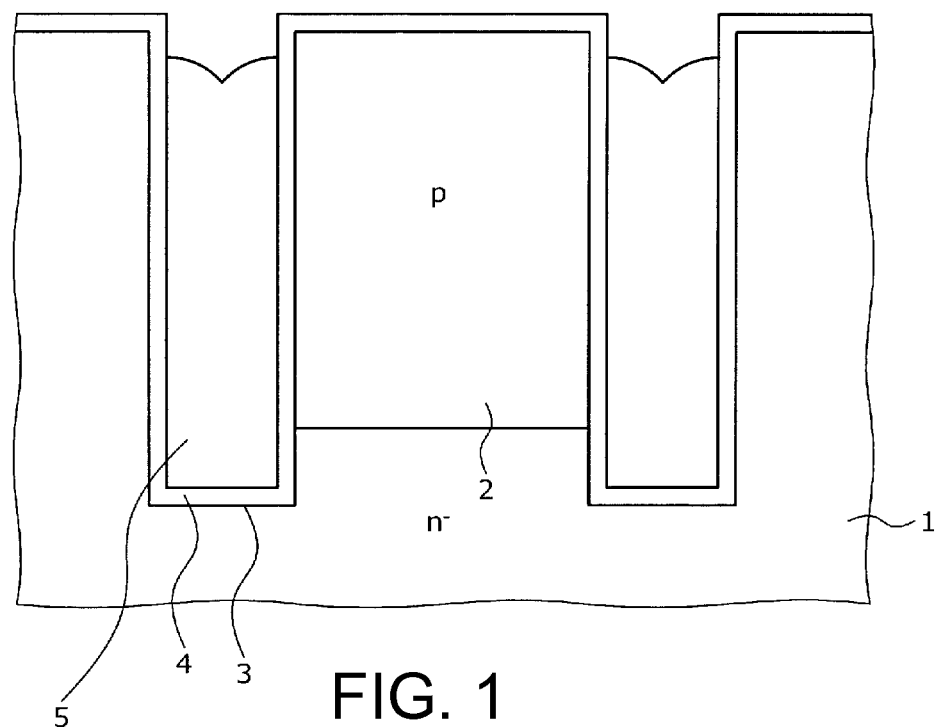
FIG. 1 is a cross-sectional view of a semiconductor device of Embodiment 1 during manufacturing.

First, as shown in FIG. 1, a p-type base region (first semiconductor region) 2 is formed in the substrate (semiconductor wafer) front surface layer of an $n^-$ semiconductor substrate (silicon (Si), for example), which will serve as an $n^-$ drift layer 1. The areas of the n-semiconductor substrate that are not the p-type base region 2 or the $p^+$ collector layer (not shown; explained later) are the $n^-$ drift layer 1. Next, a trench 3 that reaches from the substrate front surface to the $n^-$ drift layer 1 through the p-type base region 2 is formed. An example in which a plurality of the trenches 3 are arranged in striped planar patterns with prescribed gaps therebetween will be explained below. The p-type base region 2 has prescribed gaps in the direction that the trenches 3 extend in the stripe pattern in the portion (mesa area) sandwiched by the adjacent trenches 3, and a plurality of these p-type base regions are arranged in a substantially rectangular shape in a plan view. The stripe direction in which the trenches 3 extend is the depth direction of the drawing: hereinafter, the trench lengthwise direction (second direction). Specifically, the p-type base regions 2 are arranged in a checkered pattern in a plan view, for example.

Next, the front surface of the $n^-$ semiconductor substrate (namely, the surface of the p-type base region 2) and the inner walls of the trenches 3 are thermally oxidized, and a gate insulating film 4 is formed along the front surface of the $n^-$ semiconductor substrate and the inner walls of the trenches 3. A doped polysilicon layer is then grown so as to be embedded in the gate insulating film 4 inside the trenches 3, and etch-back is performed to form a gate electrode 5 inside the trenches 3 through the gate insulating film 4. Next, the front surface of the $n^-$ semiconductor substrate is thermally oxidized, and a silicon oxide film ($SiO_2$ film; not shown) that is 500 Å thick, for example, is formed on the front surface of the $n^-$ semiconductor substrate (namely, between the p-type base region 2 and the gate insulating film 4). This silicon oxide film will serve as the buffer layer for ion implantation, which will be described later.

As shown in FIGS. 2 and 3, photolithography is then performed to form a first resist mask (first mask film) 11 on the front surface of the $n^-$ semiconductor substrate, and this first resist mask has open portions corresponding to the area where the $n^+$ emitter region 6 will be formed. At this time, the first resist mask 11 is left on the surface of the gate electrode 5. In other words, everywhere except the portions corresponding to where the $n^+$ emitter regions 6 will be formed is covered by the first resist mask 11. The apertures 12 in the first resist mask 11 may have a planar shape in which the mesa area is exposed in a substantially "H"-shape whereby the width in the trench lengthwise direction of the portion of the aperture near the center of the mesa area is narrower than the width in the trench lengthwise direction of the portion of the aperture near the trench side of the mesa area, for example. The apertures 12 in the first resist mask 11 are also arranged in a plurality with gaps therebetween in the trench lengthwise direction, for example. The apertures 12 arranged in the mesa areas of the abutting individual cells are arranged so as not to face each other across the trenches 3 in the direction orthogonal to the trench lengthwise direction, or namely, the direction (horizontal direction in the drawing) in which the plurality of trenches 3 are lined up (hereinafter, the trench widthwise direction; first direction). In other words, the apertures 12 in the first resist mask 11 are arranged in a checkered pattern in a plan view, and the respective p-type base regions 2 arranged in this planar checkered pattern are selectively exposed.

Next, an n-type impurity such as arsenic (As) or phosphorous (P), for example, is injected by the first ion implantation with the first resist mask 11 as the mask, and this selectively forms the $n^+$ emitter regions 6 in the surface layer of the p-type base regions 2. The $n^+$ emitter region 6 is formed to contact the portion of the gate insulating film 4 extending along the sidewall of the trench 3. Specifically, as the first ion implantation, an ion implantation 13 is performed in which the n-type impurity is injected at an implantation angle that is perpendicular to the substrate front surface, with the first resist mask 11 as the mask (i.e., ion implantation at a 0 degree implantation angle relative to the direction perpendicular to the substrate front surface; hereinafter, "perpendicular ion injection"). At this time, the planar shape of the $n^+$ emitter region 6 is approximately the same as the apertures 12 in the first resist mask 11. Furthermore, a width w1 of the $n^+$ emitter region 6 in the trench widthwise direction is approximately equal to a width w2 of the apertures 12 in the first resist mask 11 in the trench widthwise direction. The parameters of this perpendicular ion injection 13 may be an acceleration voltage of approximately 100 keV, and an implantation dosage of approximately $3.0 \times 10^5/cm^2$, for example.

Moreover, as shown in FIG. 4, as the first ion implantation, an oblique ion implantation 14 is performed in which the n-type impurity is injected from an slanted direction at an implantation angle $\theta$ ($\theta > 0$) that is tilted toward the trench widthwise direction relative to the direction perpendicular to the substrate front surface, with the same first resist mask 11 used for the perpendicular ion injection 13. The oblique ion implantation 14 injects the n-type impurity from two directions relative to the direction perpendicular to the substrate surface: a slanted direction that is tilted towards one widthwise direction of the trenches, and a slanted direction that is tilted towards the other direction. This oblique ion implantation 14 makes it possible to set the $n^+$ emitter region 6 to a prescribed impurity concentration and to extend the $n^+$ emitter region 6 towards the center of the mesa area. The order of the first ion implantation for forming the $n^+$ emitter region 6 may be switched between the perpendicular ion implantation 13 and the oblique ion implantation 14, or may only be the oblique ion implantation 14 without the perpendicular ion implantation 13.

Specifically, the oblique ion implantation 14 makes the width w1 of the $n^+$ emitter region 6 in the trench widthwise direction greater than the width w2 of the apertures 12 in the first resist mask 11 in the trench widthwise direction, and also progressively widens the $n^+$ emitter region 6 deeper from the substrate front surface. The cross-sectional view of the $n^+$ emitter region 6 is a substantially trapezoidal shape having a width in the trench widthwise direction on the collector side (lower base) that is greater than the width in the trench widthwise direction on the emitter side (upper base), for example. The planar shape of the $n^+$ emitter region 6 is a substantially "H"-shape that has the width w1 in the trench widthwise direction greater than the planar shape of the apertures 12 in the first resist mask 11. It is preferable that the implantation angle $\theta$ of the oblique ion implantation 14 be tilted at approximately 10 to 45 degrees to the trench widthwise direction relative to the direction perpendicular to the substrate front surface, for example. The reason for this is described below.

If the implantation angle $\theta$ of the oblique ion implantation 14 is less than 10 degrees, the $n^+$ emitter region 6 will not project to the $p^+$ contact region 7. Therefore, there will be less effectiveness in suppressing an increase in the p-type impurity concentration of the sidewalls of the trench 3 caused by misalignment, as explained later. On the other hand, if the implantation angle $\theta$ of the oblique ion implantation 14 is greater than 45 degrees, then depending on the thickness of the resist mask 11, the n-type impurity of the oblique ion implantation 14 will be absorbed by the resist mask 11 and not reach the surface of the p-type base region 2. Furthermore, if the implantation angle $\theta$ of the oblique ion implantation 14 is large and causes the projection of the $n^+$ emitter region 6 to become too large, then the path for the holes from the $n^+$ emitter region 6 to the $p^+$ contact region 7 will be too long, which will increase resistance of this path and lower latchup inhibiting effects. The parameters for the oblique ion implantation 14, if the implantation angle $\theta$ is around 45 degrees, may be an acceleration voltage of approximately 80 keV, and an implantation dosage of approximately $3.0 \times 10^{15}/cm^2$, for example.

As shown in FIGS. 5 and 6, after the first photomask 11 is removed, photolithography is performed to form a second resist mask (second mask film) 15 on the front surface of the n semiconductor substrate, and this second resist mask has open portions corresponding to the area where the $p^+$ contact region 7 will be formed. Thus, everywhere except the portions corresponding to where the $p^+$ contact region 7 will be formed is covered by the second resist mask 15. Apertures 16 in the second resist mask 15 have a planar shape that exposes, in a substantially rectangular shape, the portion near the center of the mesa area, which includes the portion of the $n^+$ emitter region 6 sandwiched by the portions on the trench side (the portions equivalent to the vertical bars in the "H"-shape in a plan view), for example. Furthermore, the apertures 16 in the second resist mask 15 are arranged so as to sandwich the portions near the center of the $n^+$ emitter region 6 (the portions equivalent to the horizontal bar in the "H"-shape in a plan view). In other words, the p-type base region 2 is selectively exposed in the apertures 16 in the second resist mask 15.

Next, a second ion implantation 17 is performed with the second resist mask 15 in order to inject a p-type impurity such as boron (B), for example, at an implantation angle that is perpendicular to the substrate front surface (i.e., perpendicular ion implantation of a p-type impurity). This second ion implantation 17 selectively forms the $p^+$ contact region 7 on a portion of the front surface layer of the p-type base region 2 adjacent to the center of the mesa area. In other words, a plurality of the $p^+$ contact regions 7 are formed with prescribed gaps therebetween in the trench lengthwise direction so as to contact the closest $n^+$ emitter regions 6. Due to the second ion implantation 17 being a perpendicular ion implantation, the planar shape of the respective $p^+$ contact regions 7 is approximately the same as the apertures 16 in the second resist mask 15. The parameters for the second ion implantation 17 may be an acceleration voltage of approximately 100 keV, and an implantation dosage of approximately $3.0 \times 10^{15}/cm^2$, for example.

Figure 7:
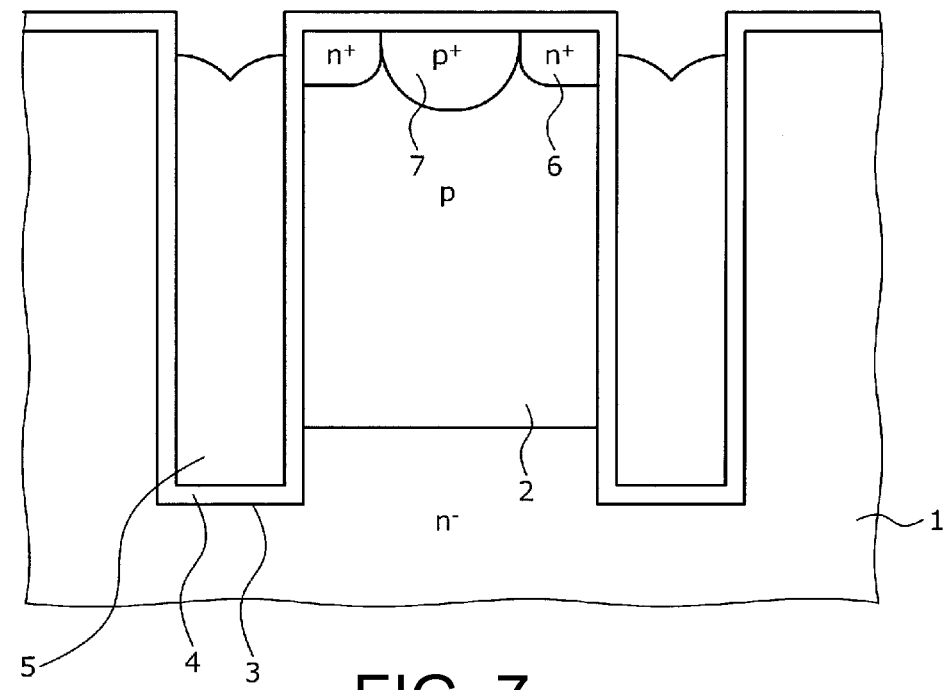
FIG. 7 is a cross-sectional view of the semiconductor device of Embodiment 1 during manufacturing.

Next, as shown in FIG. 7, after the second resist mask 15 is removed, a heat treatment is performed for approximately 30 minutes at around 900° C. to activate and thermally diffuse the impurities, for example, thereby causing the $n^+$ emitter region 6 and the $p^+$ contact region 7 to form at respective prescribed diffusion depths. The $n^+$ emitter region 6, in particular, is thermally diffused such that the top of the gate electrode 5 is positioned at a height inside the $n^+$ emitter region 6. Explained below is the reason for collectively heat treating the $n^+$ emitter region 6 and the $p^+$ contact region 7, or rather, the reason for performing the first ion implantation (the perpendicular ion implantation 13 and the oblique ion implantation 14) and then continuing to the second ion implantation 17 without performing a heat treatment between the first and second ion implantations. The first ion implantation amorphizes the portion of the semiconductor region (p-type base region 2) that has been injected with the n-type impurity. This is because, in this amorphous portion, it is possible to control the implantation depth of the p-type impurity into the semiconductor region for the second ion implantation 17. The steps up to this point form a trench gate structure MOS gate (insulated gate formed by metal-oxide film-semiconductor) configuration constituted by the p-type base region 2, the trench 3, the gate insulating film 4, the gate electrode 5, the $n^+$ emitter region 6, and the $p^+$ contact region 7.

Figure 8:
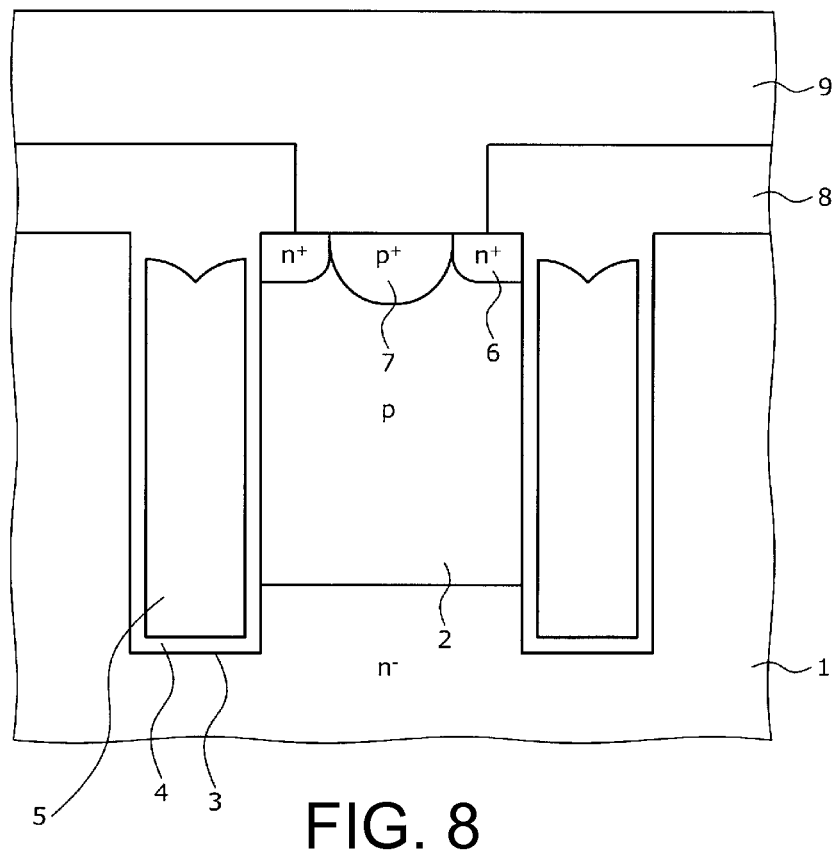
FIG. 8 is a cross-sectional view of the semiconductor device of Embodiment 1 during manufacturing.

Next, as shown in FIG. 8, the portion of the gate insulating film 4 covering the substrate front surface is removed. An interlayer insulating film 8 is then formed on the front surface of the $n^-$ semiconductor substrate to cover the gate electrode 5. Next, contact holes that expose the $n^+$ emitter region 6 and the $p^+$ contact region 7 are formed in the interlayer insulating film 8. An emitter electrode (first electrode) 9 that contacts the $n^+$ emitter region 6 and the $p^+$ contact region 7 is then formed in the front surface of the $n^-$ semiconductor substrate inside the contact holes. Next, the rest of the front surface device structure, such as the protective layer (not shown), is formed. Ordinary methods are then used to form, in the rear surface of the n-semiconductor substrate, a $p^+$ collector layer (fourth semiconductor region) and a collector electrode (second electrode), which are not shown in the drawings. Thereafter, the semiconductor wafer is cut (diced) into chip shapes, thereby completing the vertical IGBT having the trench gate structure.

As described above, Embodiment 1 makes it possible to inject the n-type impurity in not only the depth direction, but also in the lateral direction (the direction orthogonal to the depth direction), by performing, as the first ion implantation to form the $n^+$ emitter region, a perpendicular ion implantation at an implantation angle that is perpendicular to the substrate front surface, and an oblique ion implantation at an implantation angle that is tilted relative to the direction perpendicular to the substrate surface. This allows for the n-type impurity to be implanted from the portion of the p-type base region exposed by the aperture in the first resist mask to the portion below the first resist mask; thus, the $n^+$ emitter region can be formed so as to extend towards the center of the mesa area, or rather, to project into the area where the $p^+$ contact region will be formed. This enables the suppression of the p-type impurity concentration at the portion of the mesa area near the trench from becoming high, even if patterning alignment of the ion implantation mask used for forming the $p^+$ contact region deviates from the prescribed position that is based on the design parameters (i.e., deviation towards the trench). Accordingly, it is possible to suppress the p-type impurity concentration of the portion of the channel (n-type inversion layer) below the $n^+$ emitter region (collector side) from becoming higher (i.e., the portion of the p-type base region sandwiched by the $n^+$ emitter region and the $n^-$ drift layer). Due to this, the threshold voltage Vth can be suppressed from rising above a prescribed value based on the design parameters.

Furthermore, according to Embodiment 1, the first ion implantation for forming the $n^+$ emitter region is performed, and then the second ion implantation for forming the $p^+$ contact region is performed, without a heat treatment between the first and second ion implantations; therefore, it is possible to perform the second ion implantation in a state in which a portion of the area where the $p^+$ contact region will be formed on the $n^+$ emitter region side (the trench side) is amorphized. Due to this, the amorphous portion inhibits the implantation depth of the p-type impurity injected during the second ion implantation, even if the patterning alignment of the ion implantation mask used for forming the $p^+$ contact region deviates from the prescribed position that is based on the design parameters. Accordingly, it is possible to suppress the p-type impurity concentration of the portion where the channel is formed below the $n^+$ emitter region from becoming higher. Embodiment 1 also makes it possible, by widening the width in the trench lengthwise direction of the portion of the $n^+$ emitter region on the trench side, to suppress the $p^+$ contact region from laterally diffusing (in the direction orthogonal to the depth direction) during heat treatment into the portion where the channel region below the $n^+$ emitter region is formed.

Furthermore, according to Embodiment 1, oblique ion implantation for forming the $n^+$ emitter region is formed in a state in which the gate electrode surface (trench top) is covered by the ion implantation mask; therefore, the n-type impurity implanted by the oblique ion implantation is not injected into the mesa areas of the abutting single cells. Accordingly, an $n^+$ region that does not contribute to ON operation will not be formed in the mesa areas of the abutting single cells, and thus, it is possible to prevent a parasitic transistor from being formed. This enables the prevention of malfunctioning and destruction caused by the latchup of a parasitic transistor. An electric field will also not be concentrated in the $n^+$ region when the device is OFF, thereby making it possible to prevent the breakdown voltage of the device from lowering. In this manner, Embodiment 1 makes it possible to maintain prescribed values by suppressing the threshold voltage Vth from increasing beyond the prescribed values, and also makes it possible to suppress a parasitic transistor from being formed, thereby allowing for the stable fabrication (manufacturing) of a semiconductor device that has prescribed electrical properties based on the design parameters.

Embodiment 2

Figure 10:
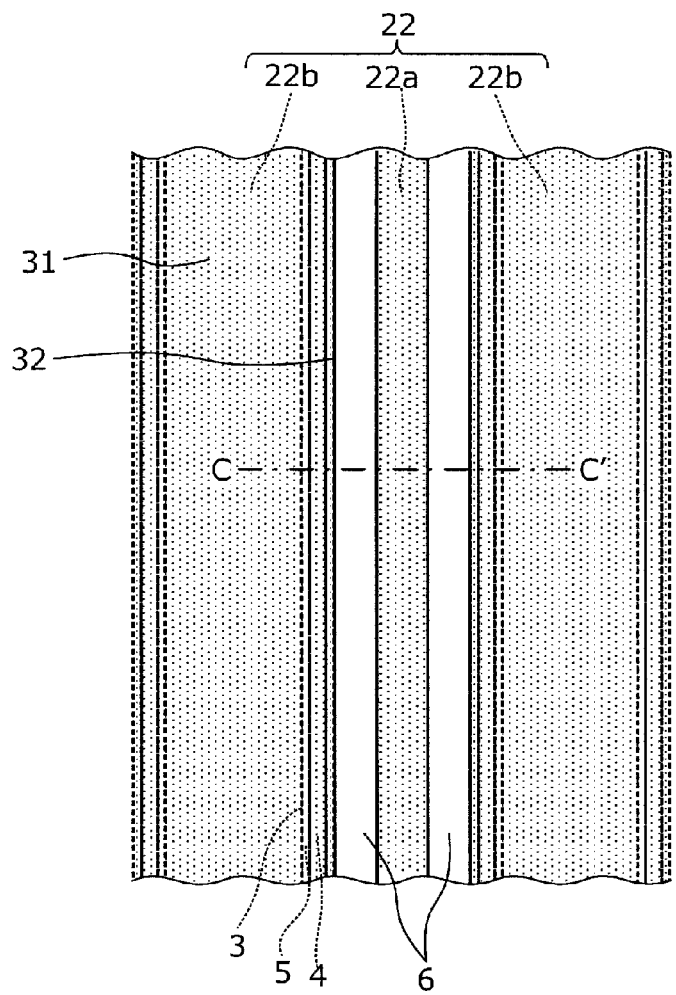
FIG. 10 is a plan view of the semiconductor device of Embodiment 2 during manufacturing.
Figure 11:
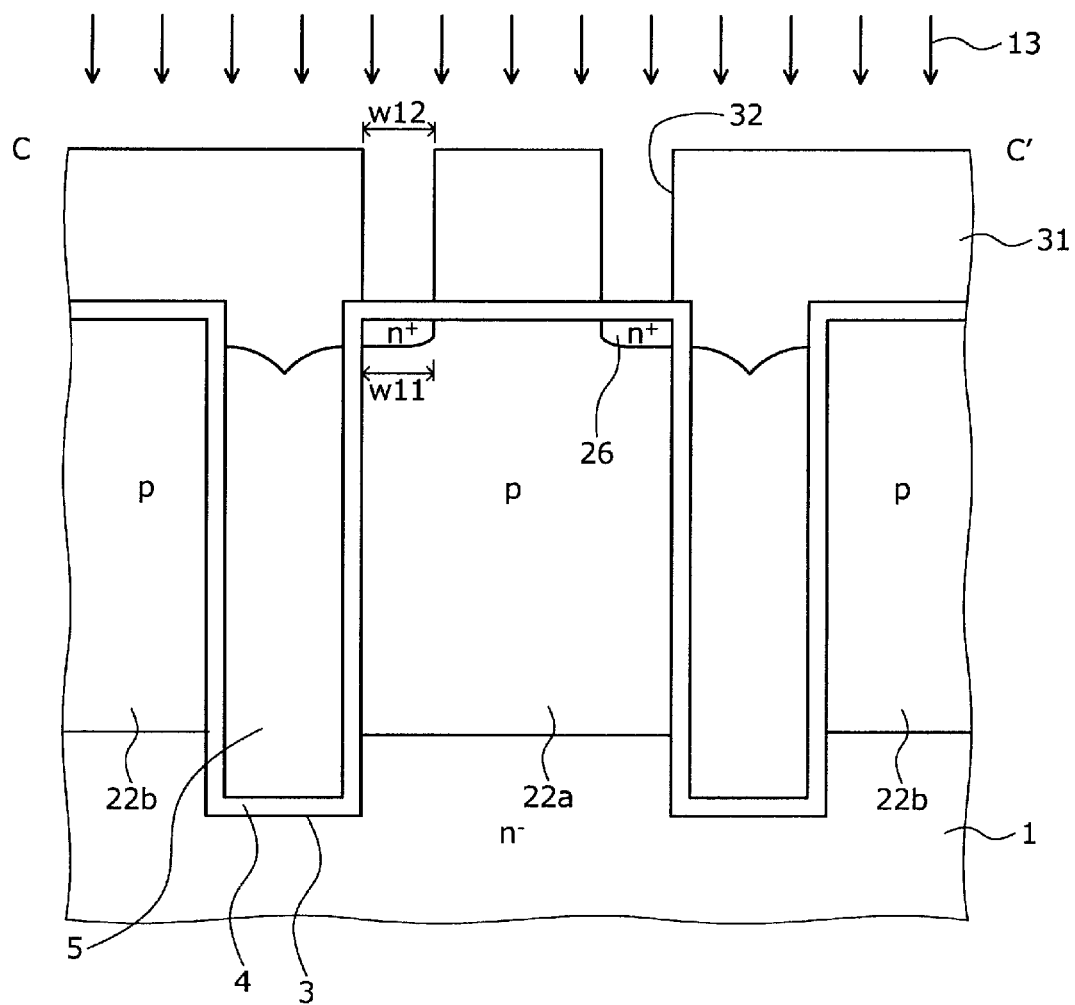
FIG. 11 is a cross-sectional view of the semiconductor device of Embodiment 2 during manufacturing.
Figure 12:
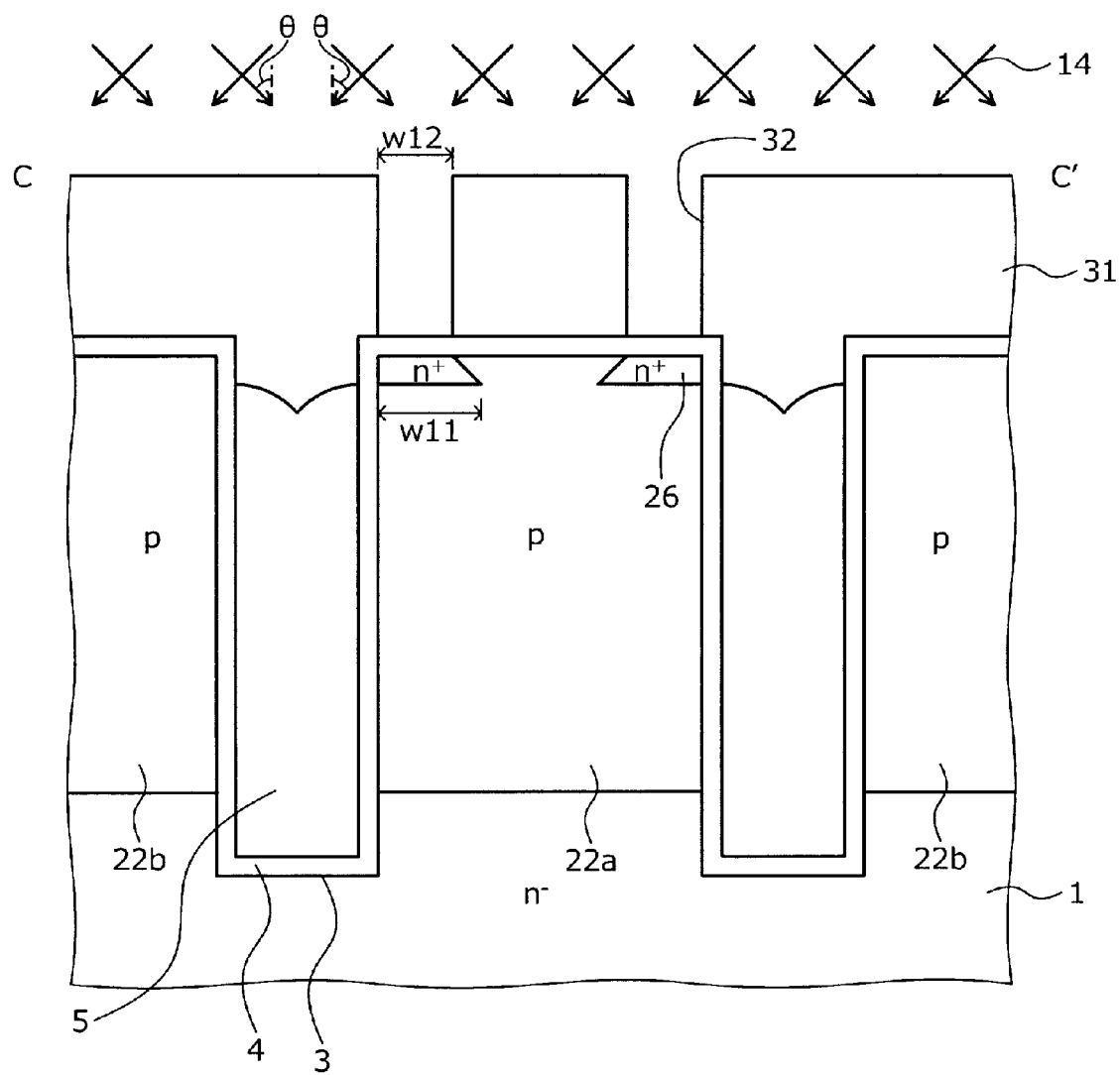
FIG. 12 is a cross-sectional view of the semiconductor device of Embodiment 2 during manufacturing.
Figure 13:
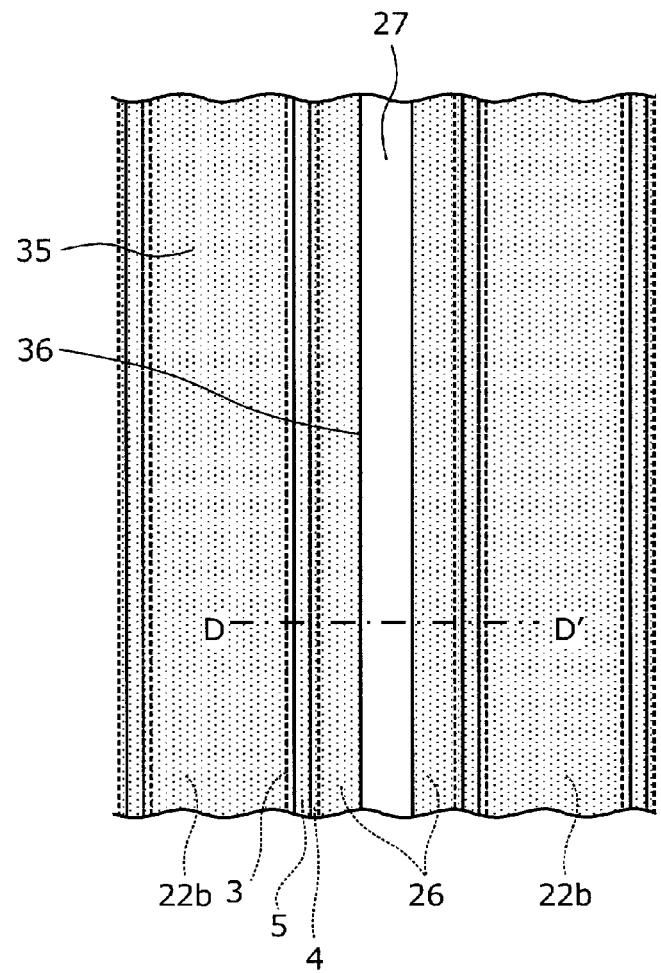
FIG. 13 is a plan view of the semiconductor device of Embodiment 2 during manufacturing.
Figure 14:
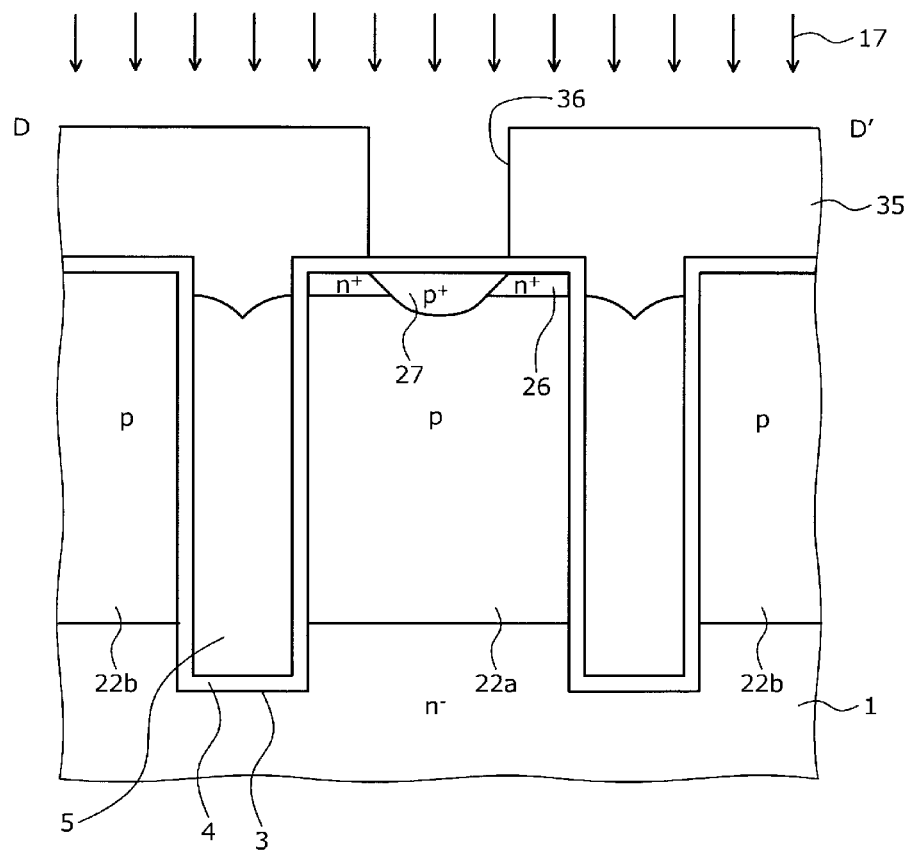
FIG. 14 is a cross-sectional view of the semiconductor device of Embodiment 2 during manufacturing.

Next, a method of manufacturing a semiconductor device according to Embodiment 2 will be described. FIGS. 9, 11, 12, and 14-16 are cross-sectional views of the semiconductor device of Embodiment 2 during the manufacturing thereof. FIGS. 10 and 13 are plan views of the semiconductor device of Embodiment 2 during the manufacturing thereof. FIGS. 10 and 13 show planar patterns of the first and second resist masks 31 and 35 for respectively forming the $n^+$ emitter region 26 and the p contact region 27. FIGS. 11 and 12 show a cross-sectional structure of FIG. 10 along the line C-C'. FIG. 14 shows a cross-sectional structure of FIG. 13 along the line D-D'.

The method of manufacturing the semiconductor device of Embodiment 2 differs from Embodiment 1 in that p-type base regions 22 are arranged in a planar stripe shape parallel to the trench lengthwise direction. Specifically, the p-type base regions 22 are divided by the trenches 3 into planar stripe shapes parallel to the trench lengthwise direction, and alternately repeat as a first p-type base region 22a and a second p-type base region 22b across the trenches 3. The first p-type base region 22a forms a channel (n-type inversion layer) when ON by having an $n^+$ type emitter region 26. The second p-type base region 22b does not have the $n^+$ emitter region 26, and is a floating region that is electrically insulated from an emitter electrode 9 by an interlayer insulating film 8.

Figure 9:
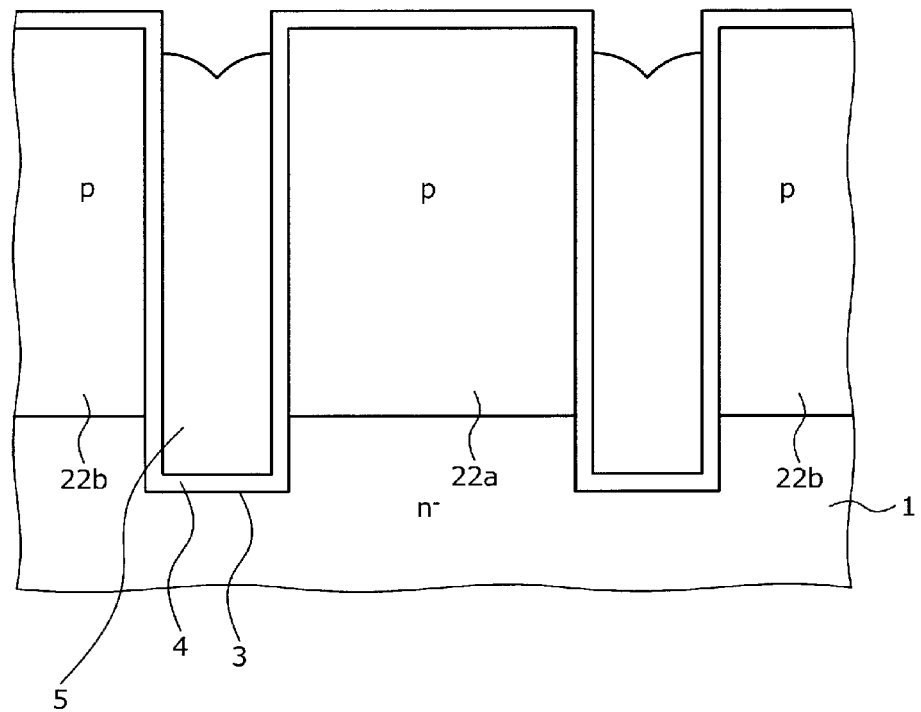
FIG. 9 is a cross-sectional view of a semiconductor device of Embodiment 2 during manufacturing.

First, as shown in FIG. 9, the p-type base region 22 is formed in the substrate front surface layer of an $n^-$ semiconductor substrate, which will serve as an $n^-$ drift layer 1. Next, a trench 3 that reaches from the substrate front surface to the $n^-$ drift layer 1 through the p-type base region 22 is formed in a stripe pattern in a plan view, similar to Embodiment 1. At this time, the p-type base region 22 is divided by the trenches 3 into a planar pattern of stripe shapes parallel to the trench lengthwise direction. Next, in a manner similar to Embodiment 1, a gate insulating film 4, gate electrode 5, and a silicon oxide film (not shown) that will serve as the buffer layer for ion implantation (described later) are formed.

As shown in FIGS. 10 and 11, photolithography is then performed to form a first resist mask 31 on the front surface of the $n^-$ semiconductor substrate, and this first resist mask has open portions corresponding to the area where the $n^+$ emitter region 26 will be formed. At this time, in a manner similar to Embodiment 1, the first resist mask 31 is left on the surface of the gate electrode 5, and everywhere except the portions corresponding to the area where the $n^+$ emitter region 26 will be formed is covered by the first resist mask 31. Apertures 32 in the first resist mask 31 expose the portions of the first p-type base region 22a on the trench 3 side in straight lines extending in the trench lengthwise direction. In other words, the first resist mask 31 has a plurality of the apertures 32 formed in a striped planar pattern extending in the trench lengthwise direction. The second p-type base region 22b is covered by the first resist mask 31.

Next, as shown in FIGS. 11 and 12, first ion implantation (perpendicular ion implantation 13 and oblique ion implantation 14) of an n-type impurity is performed with the first resist mask 31 as the mask, in a manner similar to Embodiment 1. Namely, the perpendicular ion implantation 13 forms straight-lined $n^+$ emitter regions 26 that extend in the trench lengthwise direction and that have a planar shape approximately the same as the apertures 32 in the first resist mask 31. The oblique ion implantation 14 makes a width w11 of the $n^+$ emitter region 26 in the trench widthwise direction greater than a width w12 of the apertures 32 in the first resist mask 31 in the trench widthwise direction.

As shown in FIGS. 13 and 14, the first resist mask 31 is removed, and then photolithography is performed to form a second resist mask 35 on the front surface of the n-semiconductor substrate, and this second resist mask has open portions corresponding to the area where the $p^+$ collector region 27 will be formed. At this time, in a manner similar to Embodiment 1, everywhere except the portions corresponding to where the $p^+$ contact regions 27 will be formed is covered by the second resist mask 35. Apertures 36 in the second resist mask 35 expose the portions near the center of the first p-type base region 22a in straight lines extending in the trench lengthwise direction, for example. In other words, the second resist mask 35 has a plurality of the apertures 36 formed in a striped planar pattern extending in the trench lengthwise direction. Next, second ion implantation (perpendicular implantation of a p-type impurity) 17 is performed to implant a p-type impurity with the second resist mask 35 as the mask, in a manner similar to Embodiment 1. This second ion implantation 17 selectively forms, in the portion of the first p-type base region 22a near the center of the surface layer, a p-type contact region 7 that extends as a straight line in the trench lengthwise direction and that has a planar shape approximately the same as the apertures 36 in the second resist mask 35.

Figure 15:
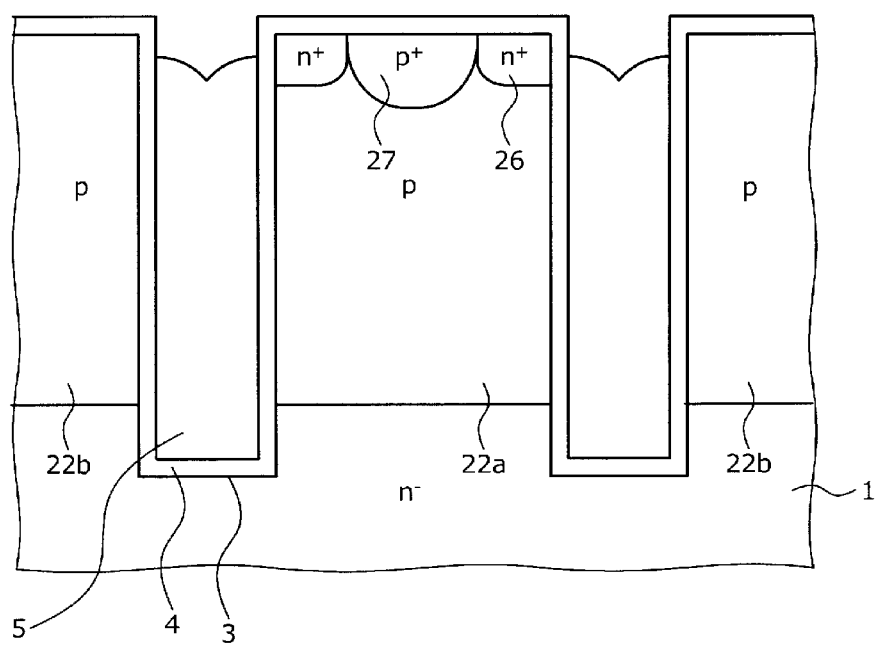
FIG. 15 is a cross-sectional view of the semiconductor device of Embodiment 2 during manufacturing.
Figure 16:
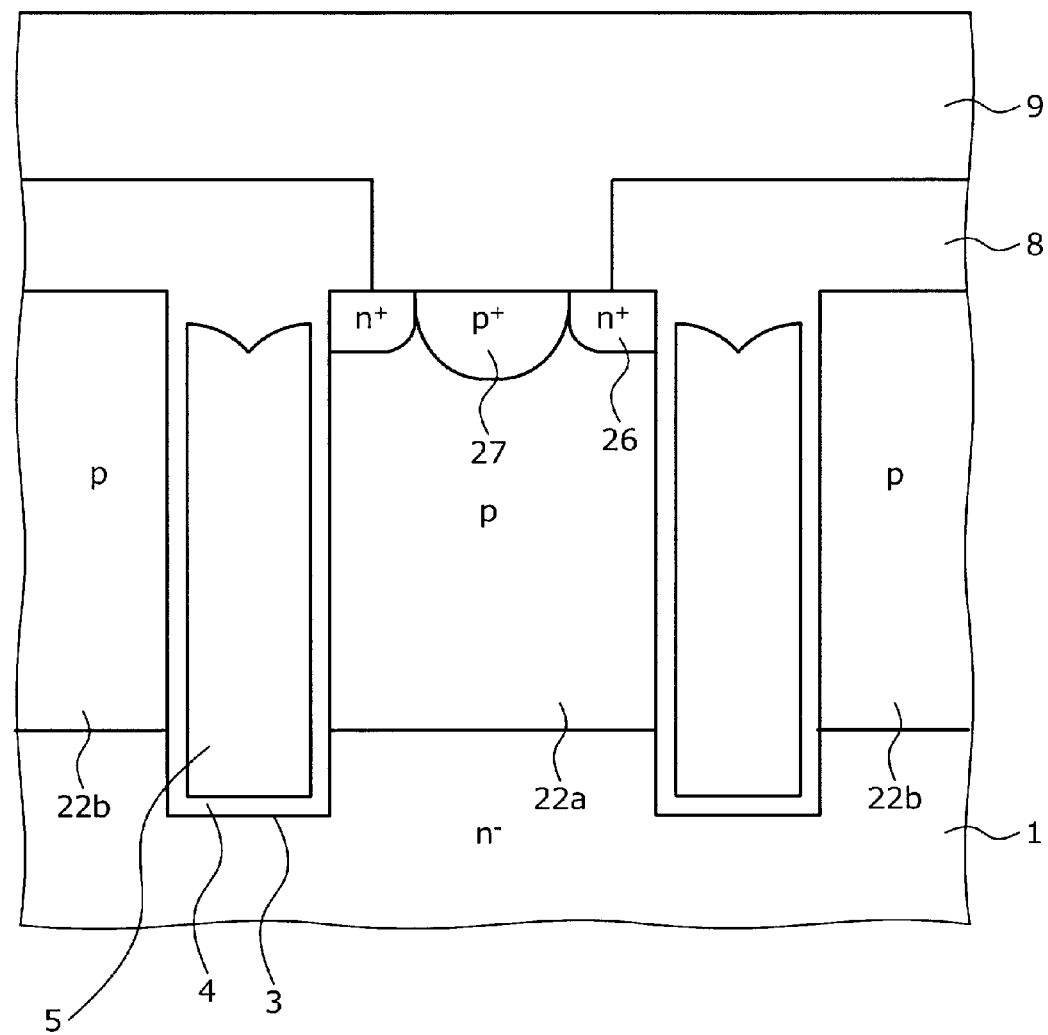
FIG. 16 is a cross-sectional view of the semiconductor device of Embodiment 2 during manufacturing.
Figure 17:
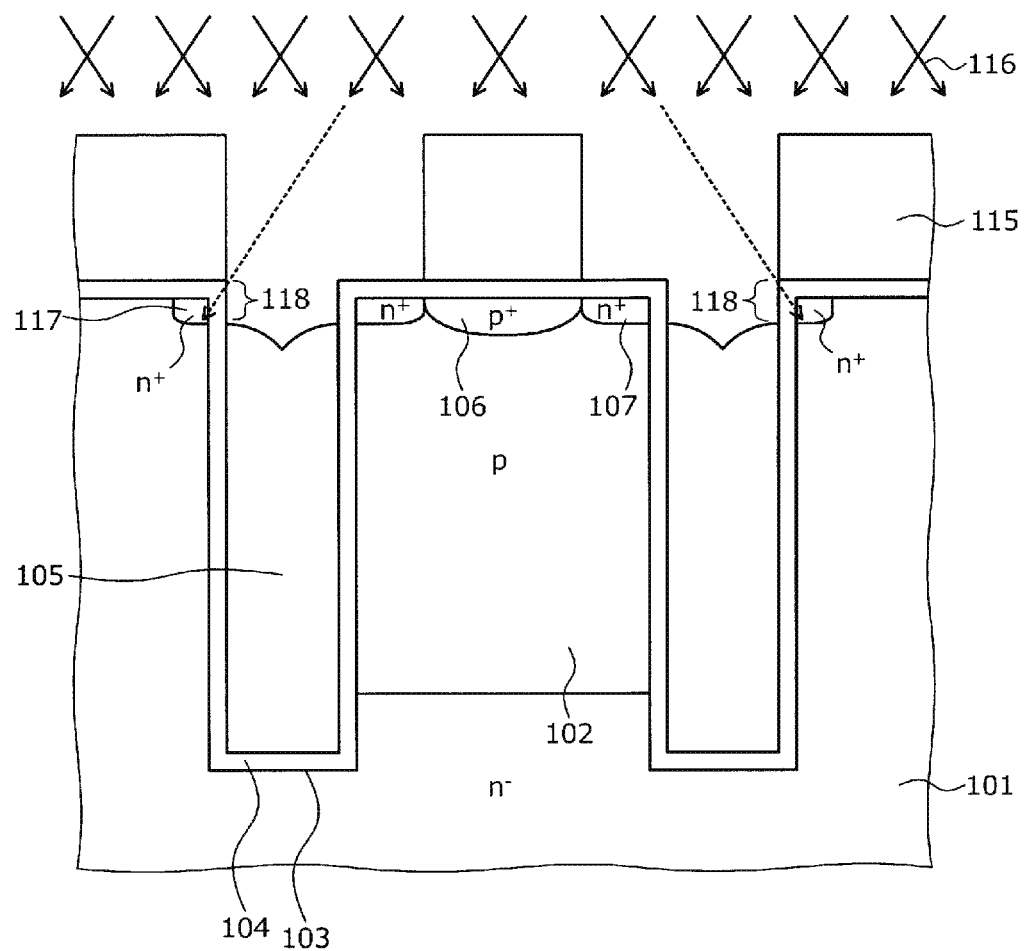
FIG. 17 is a cross-sectional view of a conventional semiconductor device during manufacturing.
Figure 18:
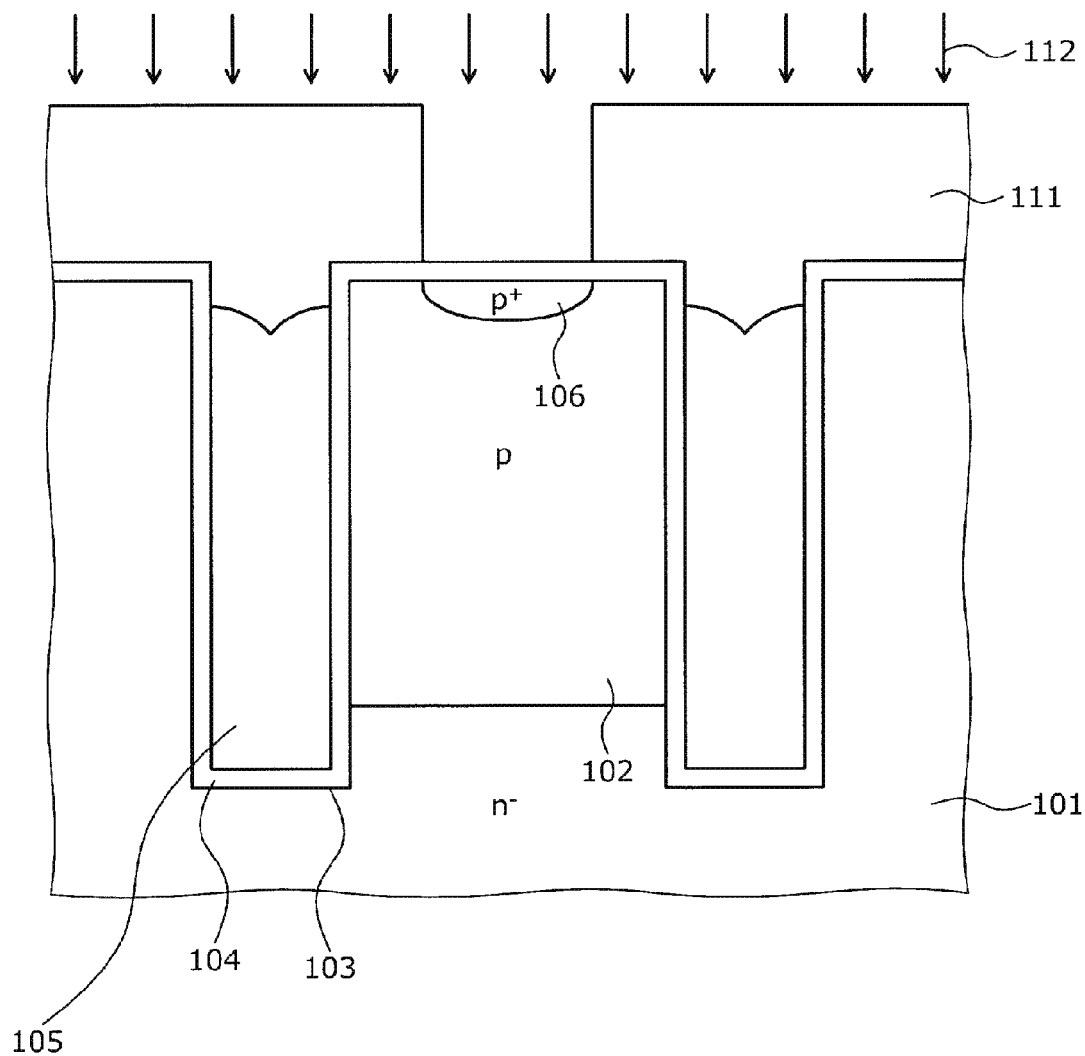
FIG. 18 is a cross-sectional view of a conventional semiconductor device during manufacturing.
Figure 19:
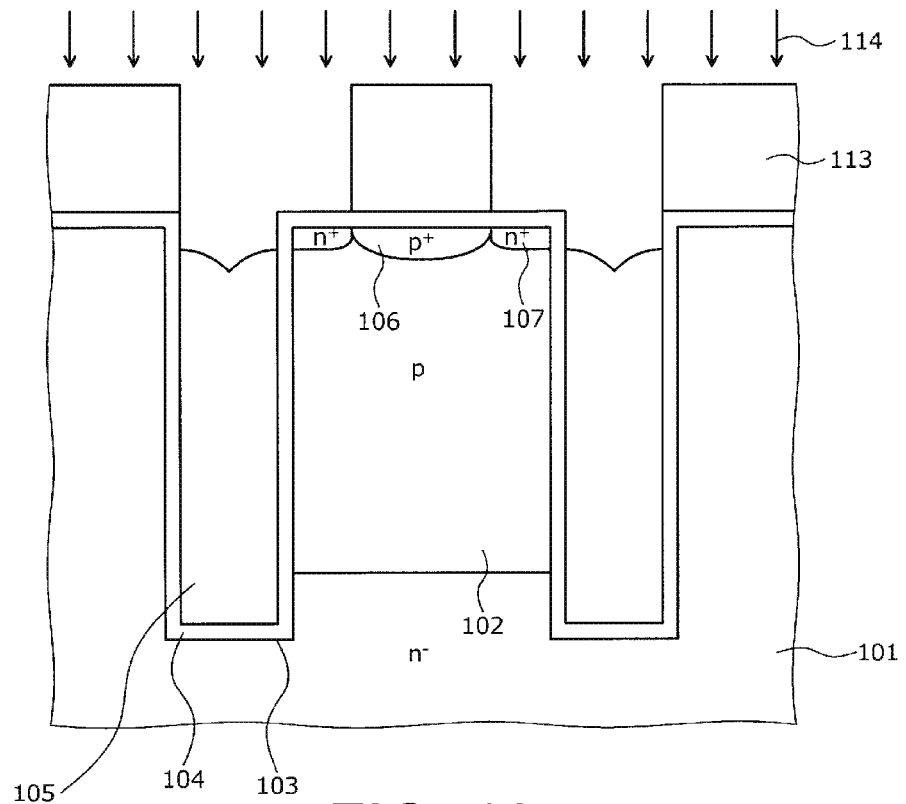
FIG. 19 is a cross-sectional view of a conventional semiconductor device during manufacturing.
Figure 20:
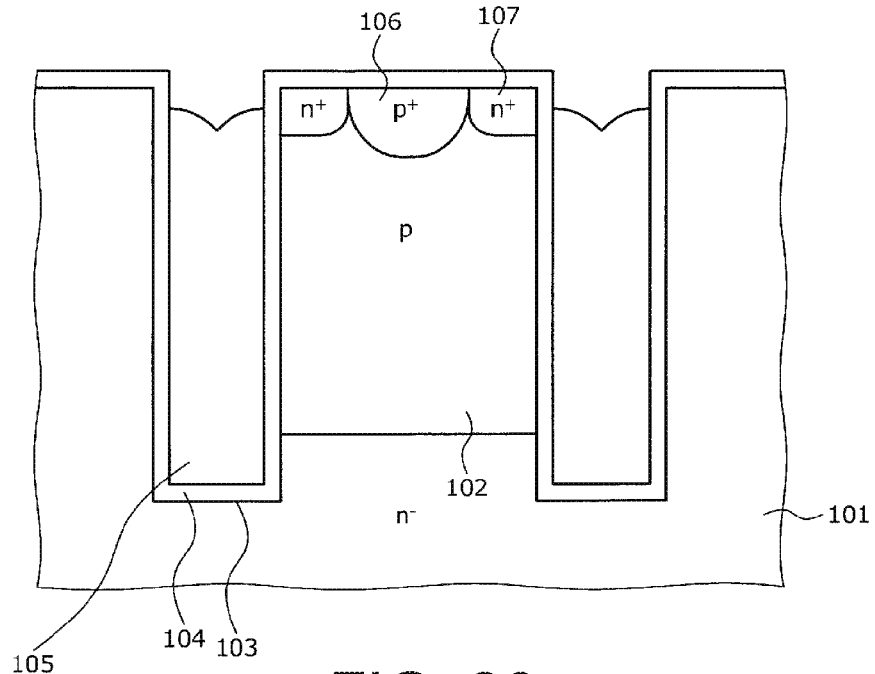
FIG. 20 is a cross-sectional view of a conventional semiconductor device during manufacturing.

Next, as shown in FIG. 15, after the second resist mask 15 is removed, the $n^+$ emitter region 26 and the $p^+$ contact region 27 are collectively heat treated to have respective prescribed diffusion depths, in a manner similar to Embodiment 1. The $n^+$ emitter region 26, in particular, is thermally diffused such that the top of the gate electrode 5 is positioned at a height inside the $n^+$ emitter region 26. Next, as shown in FIG. 16, after the portion of the gate insulating film 4 covering the substrate front surface is removed, the interlayer insulating film 8 and the emitter electrode 9 are formed in a manner similar to Embodiment 1. Then, by sequentially performing the remaining steps in a manner similar to Embodiment 1, the vertical IGBT having the trench gate structure is completed.

As described above, Embodiment 2 can obtain similar effects to Embodiment 1.

Various modifications can be made to aspects of the present invention described above without departing from the scope thereof. For example, in the respective embodiments above, the parameters for ion implantation or the like are modified in accordance with the desired specifications, etc. In the embodiments described above, an example is described in which a resist film is used as the ion implantation mask, but the present invention is not limited to this, and the ion implantation mask may be an oxide film or the like, for example, that can cover the substrate surface to prevent impurities from being implanted in non-prescribed areas. Furthermore, in the embodiments described above, IGBTs are described as an example, but the present invention can be applied to other MOS semiconductor devices having a MOS gate structure, such as insulated gate field effect transistors (MOSFETs: metal oxide semiconductor field effect transistors), for example. In the embodiments described above, the first conductivity type is n-type, and the second conductivity type is p-type, but the present invention is applicable even when the first conductivity type is p-type and the second conductivity type is n-type.

INDUSTRIAL APPLICABILITY

As described above, the method of manufacturing a semiconductor device according to at least one aspect of the present invention is useful for power semiconductor devices used in power devices in EVs, EHVs, and the like.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a semiconductor device, comprising:
    a first step of forming a first semiconductor region of a second conductivity type in a front surface of a semiconductor substrate of a first conductivity type;
    a second step of forming a plurality of trenches with prescribed gaps therebetween, said trenches penetrating the first semiconductor region in a depth direction;
    a third step of forming a gate electrode inside each of the trenches through a gate insulating film;
    a fourth step of forming, on the front surface of the semiconductor substrate, a first mask film that selectively exposes at least a portion of the first semiconductor region on a side of the trenches;
    a fifth step of forming a second semiconductor region of the first conductivity type through a first ion implantation of an impurity of the first conductivity type using the first mask film as a mask, said second semiconductor region being formed so as to contact a portion of the gate insulating film extending along a sidewall of the trenches;
    a sixth step of removing the first mask film;
    a seventh step of forming a second mask film on the front surface of the semiconductor substrate so as to selectively expose a portion of the first semiconductor region that is further away from the respective trenches than the second semiconductor region;
    an eighth step of forming, using the second mask film as a mask, a third semiconductor region of the second conductivity type through a second ion implantation of an impurity of the second conductivity type at an implantation angle that is perpendicular to the front surface of the semiconductor substrate, said third semiconductor region being formed such that an impurity concentration thereof is higher than the first semiconductor region and so as to contact the second semiconductor region; and
    a ninth step of removing the second mask film,
    wherein, in the fifth step, the first ion implantation includes an oblique ion implantation that implants the impurity of the first conductivity type at an implantation angle that is tilted towards a first direction relative to a direction perpendicular to the front surface of the semiconductor substrate, said first direction being a direction in which the plurality of trenches are arranged, and said oblique ion implantation being performed while a surface of the gate electrode is covered by the first mask film.

2. The method of manufacturing the semiconductor device according to claim 1, wherein, in the fifth step, the first ion implantation further includes, in addition to the oblique ion implantation, an ion implantation that implants the impurity of the first conductivity type at an implantation angle that is perpendicular to the front surface of the semiconductor substrate.

3. The method of manufacturing the semiconductor device according to claim 1, wherein, in the fifth step, the oblique ion implantation is performed at an implantation angle that is tilted 10 to 45 degrees towards the first direction relative to the direction perpendicular to the front surface of the semiconductor substrate.

4. The method of manufacturing the semiconductor device according to claim 1, wherein, in the fifth step, the second semiconductor region is formed so as to have an H-like planar shape in which a width in a second direction orthogonal to the first direction is greater near the trench than away from the trench.

5. The method of manufacturing the semiconductor device according to claim 1, further comprising, after the ninth step:
    a tenth step of performing a heat treatment to diffuse the second semiconductor region and the third semiconductor region to a prescribed depth.

6. The method of manufacturing the semiconductor device according to claim 5, further comprising, after the tenth step:
    forming a first electrode that contacts the second semiconductor region and the third semiconductor region;
    forming a fourth semiconductor region of the second conductivity type in a front layer of a rear surface of the semiconductor substrate; and
    forming a second electrode that contacts the fourth semiconductor region.

* * * * *